United States Patent
Park et al.

(10) Patent No.: US 9,583,514 B2
(45) Date of Patent: Feb. 28, 2017

(54) THIN FILM TRANSISTOR ARRAY SUBSTRATE

(71) Applicant: Samsung Display Co., Ltd., Yongin-si, Gyeonggi-Do (KR)

(72) Inventors: Seung Hyun Park, Seoul (KR); Jun Ho Song, Seongnam-si (KR); Jean Ho Song, Yongin-si (KR)

(73) Assignee: Samsung Display Co., Ltd., Samsung-ro, Giheung-Gu, Yongin-si, Gyeongg-Do (KR)

( * ) Notice: Subject to any disclaimer, the term of this patent is extended or adjusted under 35 U.S.C. 154(b) by 0 days.

(21) Appl. No.: 14/741,058

(22) Filed: Jun. 16, 2015

(65) Prior Publication Data

US 2016/0204138 A1 Jul. 14, 2016

(30) Foreign Application Priority Data

Jan. 8, 2015 (KR) .......................... 10-2015-0002740

(51) Int. Cl.
*H01L 27/00* (2006.01)
*H01L 27/12* (2006.01)

(52) U.S. Cl.
CPC ...... *H01L 27/1244* (2013.01); *H01L 27/1262* (2013.01)

(58) Field of Classification Search
CPC ............. H01L 27/1244; H01L 27/1262; H01L 27/1214; H01L 27/3244; H01L 27/1248; H01L 27/322
See application file for complete search history.

(56) References Cited

U.S. PATENT DOCUMENTS 7,750,999 B2 * 7/2010 Park ..................... G02F 1/13394
349/110

FOREIGN PATENT DOCUMENTS

| JP | 2002-082357 A | 3/2002 |
| KR | 10-2008-0025552 A | 3/2008 |
| KR | 10-2011-0122474 A | 11/2011 |

* cited by examiner

*Primary Examiner* — Nikolay Yushin
(74) *Attorney, Agent, or Firm* — Robert E. Bushnell, Esq.

(57) ABSTRACT

The present invention relates to a thin film transistor array substrate and a method of manufacturing the same. The thin film transistor array substrate may comprise a substrate which has a plurality of gate lines extending in a column direction along a boundary of pixels, a plurality of data lines extending in a row direction along the boundary of the pixels, and at least one thin film transistor formed in the pixel region; a first insulating film which covers the thin film transistor; a color organic film which is disposed on the first insulating film and has a valley area formed with a valley by partial superimposition of organic films of different colors based on the data lines; a second insulating film which covers the color organic film and the valley area; and a pixel electrode which is disposed on the second insulating film and connected to the thin film transistor via a contact hole, wherein the thin film transistor array substrate is provided with a separating organic film which extends from the color organic film and is disposed between the valley area and the contact hole.

12 Claims, 17 Drawing Sheets

THIN FILM TRANSISTOR ARRAY SUBSTRATE

CLAIM OF PRIORITY

This application claims the priority of and all the benefits accruing under 35 U.S.C. §119 from Korean Patent Application No. 10-2015-0002740, filed on Jan. 8, 2015 in the Korean Intellectual Property Office (KIPO), which is hereby incorporated by reference for all purposes as if fully set forth herein.

BACKGROUND OF THE INVENTION

Field of the Invention

Exemplary embodiments of the present invention relates to a thin film transistor array substrate and a method of manufacturing the same.

Description of the Related Art

A liquid display device (LCD) is configured to include a thin film transistor (TFT) array substrate and a counter substrate opposed thereto, and a liquid crystal layer interposed therebetween. The thin film transistor array substrate is provided with a plurality of thin film transistors and pixel electrodes. Moreover, a counter substrate of a general liquid crystal display device is provided with a common electrode, a black matrix and a color filter. However, there has been a need to provide at least one of the common electrode, the black matrix and the color filter within the thin film transistor array substrate, depending on conditions such as planarization characteristics, process efficiency, optical characteristics, alignment issues and viewing angle of each substrate.

Among them, since a structure of COA (Color On Array) in which the color filters are provided in the thin film transistor array substrate is able to improve the planarization characteristics, the optical characteristics, and the alignment issues of the substrate of the liquid crystal display device, a lot of research is being done for commercialization.

In particular, attempts have been made to improve a design of a color organic film and achieve improved manufacturing process and yield, by forming the color organic film within the thin film transistor array substrate.

The conventional thin film transistor is disposed adjacent to the data wiring, and the color organic films are disposed so as to be superimposed with each other for arrangement of the color organic films in a region in which the wiring such as data line is disposed. Moreover, a structure is generally used in which one of the different color organic films is disposed in each pixel region, and a pixel electrode is disposed on the color organic film.

However, residues occur during photolithography process of forming the pixel electrode on the color organic film and short-circuit failure between the pixel electrodes occurs, which may become a cause of lowering the yield of the thin film transistor array substrate.

The above information disclosed in this Background section is only for enhancement of understanding of the background of the inventive concept, and, therefore, it may contain information that does not form the prior art that is already known in this country to a person of ordinary skill in the art.

SUMMARY OF THE INVENTION

Aspects of the present invention provide a thin film transistor array substrate which prevents the short-circuit failure and improves the process yield, and a method of manufacturing the same.

Aspects of the present invention are not limited to the above-mentioned technical problems, and other technical problems which have not been mentioned will be clearly understood by those skilled in the art from the following description.

According to an exemplary embodiment of the present invention, a thin film transistor array substrate may comprise: a substrate which has a plurality of gate lines extending in a column direction along a boundary of pixels, a plurality of data lines extending in a row direction along the boundary of the pixels, and at least one thin film transistor formed in the pixel region; a first insulating film which covers the thin film transistor; a color organic film which is disposed on the first insulating film and has a valley area formed with a valley by partial superimposition of organic films of different colors based on the data lines; a second insulating film which covers the color organic film and the valley area; and a pixel electrode which is disposed on the second insulating film and connected to the thin film transistor via a contact hole, wherein the thin film transistor array substrate is provided with a separating organic film which extends from the color organic film and is disposed between the valley area and the contact hole.

The thin film transistor may include: a gate electrode which branches from the gate line for each pixel; a source electrode branching from the data line, and a drain electrode spaced apart from the source electrode; and an extension electrode which is disposed between the data line and the source electrode to space the data line and the contact hole apart from each other.

The data line, the source electrode and the extension electrode may be integrally formed.

A separating organic film may be disposed on the extension electrode, and an extension pixel electrode extending from the pixel electrode and disposed on the separating organic film is further disposed on the separating organic film.

The color organic film overlaps the gate line, and the color organic films of different colors may be disposed around the data line.

The valley area may be disposed in a region in which the color organic film is superimposed on the data line, or in a region in which the separating organic film is superimposed on the data line.

A residue pattern may be disposed in at least one valley area.

The residue pattern may be formed of the same material as that of the pixel electrode.

The separating organic film may be disposed in the separation space between the contact hole and the valley area and is disposed as a flattened surface.

A common electrode may be further disposed between the color organic film and the second insulating film.

An open area, in which the color organic film may be removed, is disposed in the formation region of the thin film transistor, and the separating organic film is disposed between the open area and the valley area.

The open area may further include a region in which the contact hole is disposed.

A residue electrode may be further disposed on the second insulating film or on a side wall of the color organic film in the open area.

At least one residue electrode may be disposed so as to be connected to the pixel electrode or the extension pixel electrode.

According to another exemplary embodiment of the present invention, A method of manufacturing a thin film transistor array substrate, the method may comprise: forming a plurality of data lines extending in a column direction along a boundary of pixels on a substrate, a plurality of the gate lines extending in a row direction along the boundary of the pixels, and at least one thin film transistor in the pixel region; forming a first insulating film on the whole surface of the substrate on which the thin film transistor is formed; forming a color organic film which is disposed on the insulating film and has a valley area formed with a valley by partial superimposition of the organic films of different colors based on the data line; forming a second insulating film which covers the color organic film and the valley area, and forming a contact hole by exposing a part of a drain electrode of the data line; and forming a pixel electrode which is disposed on the second insulating film and is connected to the thin film transistor through the contact hole, simultaneously forming a separating organic film for spacing the valley area and the contact hole, while being formed from the color organic film.

Forming the thin film transistor may comprise: forming a gate electrode which branches from the gate line for each pixel; forming a source electrode branching from the data line, and a drain electrode spaced apart from the source electrode; and forming an extension electrode which is disposed between the data line and the source electrode to space the data line and the contact hole apart from each other.

The separating organic film may be formed at a corresponding position on the extension electrode, and an extension pixel electrode is further formed so as to be disposed on the separating organic film, by being formed to extend from the pixel electrode on the separating organic film.

In forming the pixel electrode which may be disposed on the second insulating film and connected to the thin film transistor through the contact hole, the residue pattern is simultaneously formed in at least one valley area.

In simultaneously may form the separating organic film for spacing the valley area and the contact hole while being formed from the color organic film, the separating organic film disposed in a separation space between the contact hole and the valley area is formed as a flattened surface.

The specific matters of other embodiments are included in the detailed description and the drawings.

According to embodiments of the present invention, there are at least the following effects.

It is possible to provide a thin film transistor array substrate that is capable of solving an occurrence of short-circuit failure and improving the manufacturing yield, a thin film transistor substrate for manufacturing the same, and a method of manufacturing the same.

Effects of the present invention are not limited by the content illustrated above, and further various effects are included herein.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Description describes one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiments of the present invention will be described below with reference to the drawings.

Figure 1:
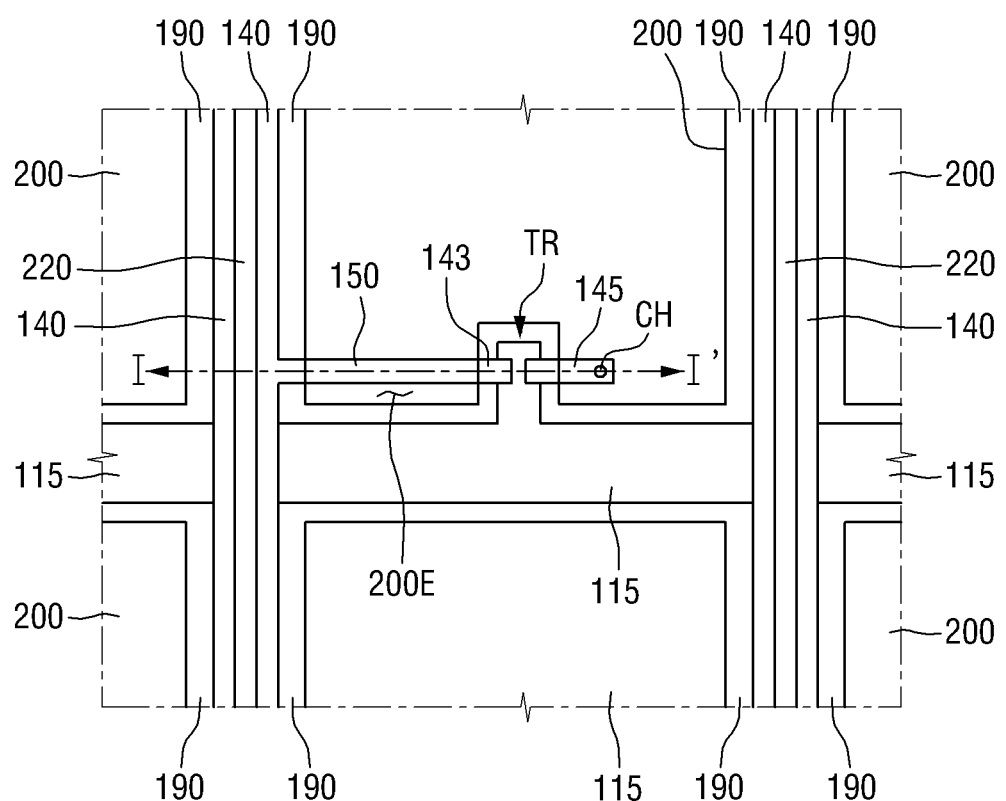
FIG. 1 is a plan view of a thin film transistor array substrate according to an embodiment of the present invention.
Figure 2:
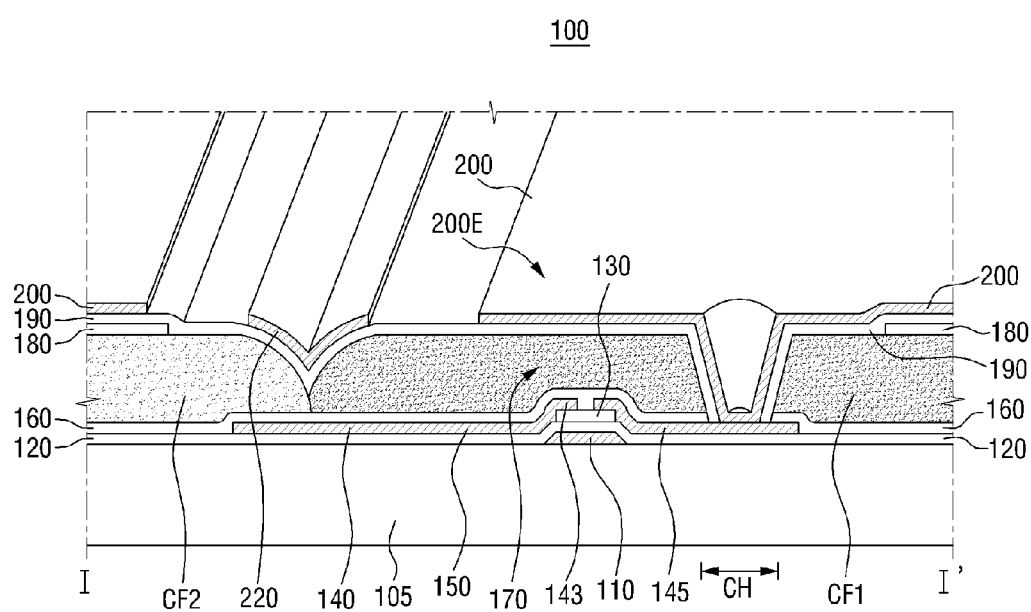
FIG. 2 is a perspective view of the thin film transistor array substrate according to an embodiment of the present invention.
Figure 3:
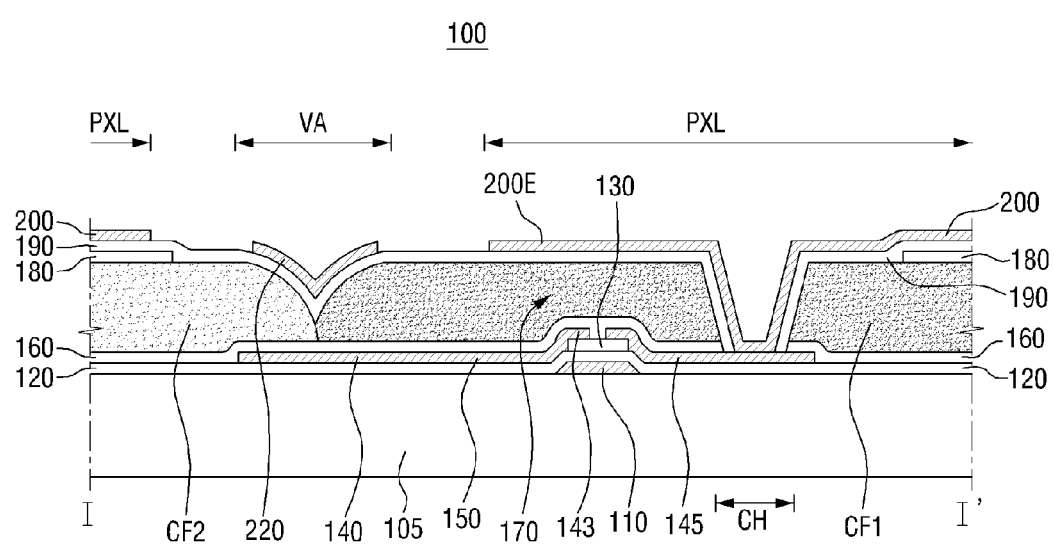
FIG. 3 is a cross-sectional view taken along a line I-I' of FIG. 1.

FIG. 1 is a plan view of a thin film transistor array substrate according to an embodiment of the present invention, FIG. 2 is a perspective view of the thin film transistor array substrate according to an embodiment of the present invention, and FIG. 3 is a cross-sectional view taken along a line I-I' of FIG. 1.

Referring to FIG. 1, a thin film transistor array substrate 100 according to an embodiment of the present invention includes multiple pixels arranged in a matrix form, and multiple thin film transistors TR provided for each pixel. Multiple gate lines 115 extending along a boundary of the pixels are arranged in a row direction of the pixels, and multiple data lines 140 extending along the boundary of the pixels are arranged in a column direction of the pixels.

A thin film transistor (TR) including a gate electrode 110, a source electrode 143 and a drain electrode 145 can be disposed in a pixel region (PXL) that is defined by intersection of the the gate line 115 and the data line 140.

A pixel electrode 200 disposed on the pixel region (PXL) is surrounded by the gate line 115 and the data line 140 and can occupy most of the region of each pixel. The pixel electrode 200 is electrically connected to the drain electrode 145 of the thin film transistor (TR) through a contact hole (CH) and can receive the application of the pixel voltage by the thin film transistor (TR). Due to reasons of the manufacturing process, a residue pattern 220 formed of the same material as that of the pixel electrode 200 can be further disposed on at least one data line 140.

The contact hole (CH) can be disposed on the pixel region (PXL) and can be disposed in a region spaced from the data line 140 at a predetermined interval via an extension electrode 150. An extension pixel electrode 200E extended from the pixel electrode 200 can be further disposed in a region between the contact hole (CH) and the data line 140. In other words, the extension pixel electrode 200E can be disposed on a region corresponding to the disposition region of the extension electrode 150.

A color organic film (CF) having any one color of red (R), green (G) and blue (B) can be provided in each pixel region (PXL). The disposition of these colors illustrated in FIG. 1 has a shape in which red, green and blue are alternately arranged as it progresses in the row direction. However, all the pixels belonging to the same column may be provided with the organic film of the same color.

Referring to FIGS. 1 to 3, on the thin film transistor array substrate 100, a thin film transistor (TR) is formed which performs the functions as a switching element for controlling the operation of each pixel and a driving element for driving each pixel.

The thin film transistor (TR) includes a substrate 105, a gate electrode 110 disposed on the substrate 105, a gate insulating film 120 disposed on the whole surface of the substrate on which the gate electrode 110 is formed, a semiconductor layer 130 disposed on the gate insulating film 120, a source electrode 143 and a drain electrode 145 disposed so as to be partially superimposed on the semiconductor layer 130, a first insulating film 160 disposed on the whole surface of the substrate on which the source electrode 143 and the drain electrode 145 are formed, a second insulating film 180, and a pixel electrode 200 which is formed to pass through the first and second insulating films 160 and 180. Here, an extension electrode 150 can be further disposed between the data line 140 and the source electrode 143 so that the contact hole (CH) is spaced apart from the data line 140 at a predetermined interval.

First, as the base substrate of the thin film transistor array substrate 100, it is possible to use a substrate 105 made of transparent glass, quartz, plastic or the like.

In a region in which the thin film transistor (TR) is disposed on the substrate 105, that is, in the pixel region (PXL), the gate electrode 110 formed to protrude from the gate line 115 can be disposed. The gate electrode 110 may also be formed of a protruding shape as well as a plate shape or the like.

On the whole surface of the substrate 105 including the gate electrode 110, the gate insulating film 120 formed of a single film made of silicon oxide or silicon nitride or a laminated film thereof can be disposed.

The semiconductor layer 130 formed so as to be superimposed with at least a part of the gate electrode 110 can be disposed on the gate insulating film 120. The semiconductor layer 130 can be formed of hydrogenated amorphous silicon, hydrogenated amorphous silicon, polycrystalline silicon, or an oxide-based oxide semiconductor including zinc oxide (ZnO) or the like.

Meanwhile, although it is not illustrated in the drawings, an ohmic contact layer made of a material such as $n^+$ hydrogenated amorphous silicon, in which silicide or n-type impurity is doped at high density, can be disposed on the top of the semiconductor layer 130.

The source electrode 143 and the drain electrode 145 positioned so as to be at least partially superimposed with the semiconductor layer 130 can be disposed on the semiconductor layer 130. The source electrode 143 and the drain electrode 145 can be disposed on the ohmic contact layer. The ohmic contact layer can serve to lower the contact resistance therebetween.

The contact hole (CH) for connection to the pixel electrode 200 can be disposed on the drain electrode 145. The extension electrode 150 can be further disposed between the data line 140 and the source electrode 143. The position of the contact hole (CH) can be spaced apart from the data line 140 at a predetermined interval through the extension electrode 150. The disposition region of the thin film transistor (TR) may be changed via the extension electrode 150.

In this embodiment, while the extension electrode 150 is illustrated as being disposed between the source electrode 143 and the data line 140, the extension electrode 150 may be disposed in the drain electrode 145 to separate the contact hole (CH) and the data line 140 from each other. When the extension electrode 150 is disposed in the drain electrode 145 in this way, the formation position of the thin film transistor (TR) may not be changed.

The first insulating film 160, the color organic films (CF1, CF2) and the second insulating film 180 can be sequentially disposed on the substrate 105 on which the source electrode 143, the drain electrode 145 and the extension electrode 150 are disposed as described above. Hereinafter, the color organic film is commonly called CF, and when indicating the color organic films (CF) of different colors, they are referred to as different colors such as a first color organic film (CF1) and a second color organic film (CF2).

The first insulating film 160 can be formed of inorganic material consisting of silicon nitride (SiNx) or silicon oxide (SiOx). The first insulating film 160 can be formed of a single layer or a laminated film thereof made up of silicon nitride (SiNx) or silicon oxide (SiOx). The first insulating film 160 is able to come into contact with the semiconductor layer 130 exposed between the source electrode 143 and the drain electrode 145.

The color organic film (CF) can be disposed on the first insulating film 160. The common electrode 180 can be disposed on the color organic film 170.

In this way, by disposition the color organic film (CF) on the first insulating film 160, it is possible to have a double film structure of a lower inorganic film and an upper organic film so as to protect the portion of the exposed semiconductor layer 130 while taking advantage of the excellent planarization characteristics of the color organic film (CF). Accordingly, it is possible to improve the aperture ratio of the display device including the thin film transistor array substrate 100 according to the present embodiment.

Meanwhile, it is possible to dispose specific color organic films (CF1, CF2) for each pixel region (PXL). In a region in which the color organic films (CF1, CF2) of different colors are in contact with each other, the color organic films (CF1, CF2) can be disposed so as to be superimposed with each other.

Red, green or blue color organic film (CF) is formed in the pixel region (PXL). The color organic films (CF) are connected to each other along the column of pixels, but they are are separated from the adjacent column. In other words, the color organic films (CF) overlap on the gate line 115, but they partially overlap on the data line 140, and the respective color organic films (CF) are separated from each other around the data line 140. Therefore, the colors of the color organic films (CF) separated around the data line 140 alternately change.

For example, when the green organic film (CF1) is disposed in one pixel region (PXL), the blue organic film (CF2) can be disposed in the adjacent pixel region (PXL). Thus, on the boundary between the green organic film and the blue organic film, the organic films are disposed so as to be only partially superimposed with each other, and a valley area (VA) having a valley shape can be disposed.

In this way, the color organic films (CF) of different colors can be disposed based on the data line 140 as a boundary, and the valley area (VA) having a valley shape formed by partial superimposition of the first and second organic films (CF1, CF2) can be disposed on the data line 140.

Here, the residue pattern 220 can be disposed on at least one valley area (VA). The residue pattern 220 can be formed by the partial metal material layer being left below the photoresist by the different thicknesses of photoresist while performing a photo-mask process. The metal material layer may be a metal material layer that forms the common electrode 180 or the pixel electrode 200.

To briefly explain the residue pattern 220, the valley area (VA) can be formed in the superimposed region of the partially superimposed color organic films (CF). The valley area (VA) can generate the residue by the unreacted photoresist in the course of a photo-mask process of patterning the pixel electrode 200.

This can occur because the thickness of the photoresist of the formation region of the valley area (VA) is different from the thickness of the photoresist of the region which is not formed with the valley area, that is, the thickness of the photoresist of the region of the flattened surface.

In this way, in the region in which the residue occurs, the conductive material attempted to be used as the pixel electrode 200 remains as it is, and short-circuit failure between the pixel electrodes 200 occurs, which may be a cause of lowering the yield of the thin film transistor array substrate.

A separating organic film 170 can be disposed between the valley area (VA) and the contact hole (CH). The separating organic film 170 may be an organic film having the same color as the color organic film (CF) that is disposed on the same pixel region (PXL). The separating organic film 170 can separate the contact hole (CH) and the valley area (VA) from each other to prevent the residue pattern 220 or the residue electrode disposed adjacent to the pixel electrodes 200 from coming into contact with or being connected to each other.

The valley area (VA) can be disposed in a region in which the first color organic film (CF1) and the second color organic film (CF2) are partially superimposed with each other on the data line (140), or the valley area (VA) can be disposed in a region in which the separating organic film 170 and the second color organic film (CF2) are partially superimposed with each other on the data line 140. Here, the separating organic film 170 can be an organic film having the same color as the first color organic film (CF1) or an organic film that is formed integrally with the first color organic film (CF1).

The second insulating film 190 can be disposed on the first insulating film 160. The common electrode 180 can be disposed between the first insulating film 160 and the second insulating film 190. As described above, the residue pattern 220 can also be formed while forming the common electrode 180.

The contact hole (CH) passing through the color organic film (CF) can be disposed on the drain electrode 145. The pixel electrode 200 can be disposed on the contact hole (CH). The pixel electrode 200 disposed on the contact hole (CU) can be formed of a transparent conductance oxide (TCO) including ITO (indium tin oxide), IZO (indium zinc oxide or the like.

In other words, the contact hole (CH) is formed to pass through the first and second insulating films 160, 190 and the color organic film (CF), and the pixel electrode 200 disposed on the second insulating film 190 can be connected to the drain electrode 145 through the contact hole (CH).

The pixel electrode 200 can be disposed on the color organic film (CF), and an extension pixel electrode 200E formed integrally with the pixel electrode 200 can be disposed on the separating organic film 170.

To explain the relations between the residue pattern 200 and the pixel electrode 200 again, the valley area (VA) is disposed on the data line 140, and the residue pattern 220 formed of the same material as that of the pixel electrode 200 or the common electrode 180 can be disposed in at least one valley area (VA).

As illustrated in the drawings, the above-mentioned residue pattern 220 can be disposed in the vertical direction of the pixel region (PXL), as the valley area (VA) can be disposed along the data line 140.

When the valley area (VA) and the contact hole (CH) are disposed adjacent to each other, the residue pattern 220 and the pixel electrode 200 are connected to each other due to failure of photo properties of the photoresist during the manufacturing process, and thus, a failure may occur in which the upper and lower pixel electrodes 200 are connected to each other. As the contact hole (CH) is disposed on the data line 140, that is, in adjacent to the residue pattern 220 disposed in the valley area (VA), a problem may occur in which the residue pattern 220 connects the upper and lower pixel electrodes 200, and the upper/lower pixel electrodes 200 are short-circuited and simultaneously turned on or off.

However, in the thin film transistor array substrate 100 according to the present embodiment, by separating the residue pattern 220 and the contact hole (CH) capable of being disposed in the valley area (VA) through the separating organic film 170, it is possible to reduce the probability of failure occurrence in which the residue pattern 220 and the pixel electrode 200 are connected to each other.

Therefore, the separating organic film 170 separates the contact hole (H) and the valley area (VA) from each other, and in addition, it can provide a separation space which can prevent the residue patterns 220 formed due to the failure of photo properties from being connected to the adjacent electrodes (e.g., the common electrode 180 or the pixel electrode 200). That is, when performing the photo-mask process, the separation space can provide a control space capable of providing a controllable flattened surface in the photo-mask process to separate the electrodes and the residue pattern 220 from each other.

Thus, the separating organic film 170 can provide a flattened space between the contact hole (CH) and the valley area (VA) in which the failure of photo properties mainly occurs, thereby providing a separation space which can allow floating of the residue pattern 220 formed due to the failure of photo properties.

In addition, the thin film transistor (TR) according to the present embodiment and the display device including the same can improve the aperture ratio by allowing the color organic film (CF) and the separating organic film 170 to also function as a planarization film.

Figure 4:
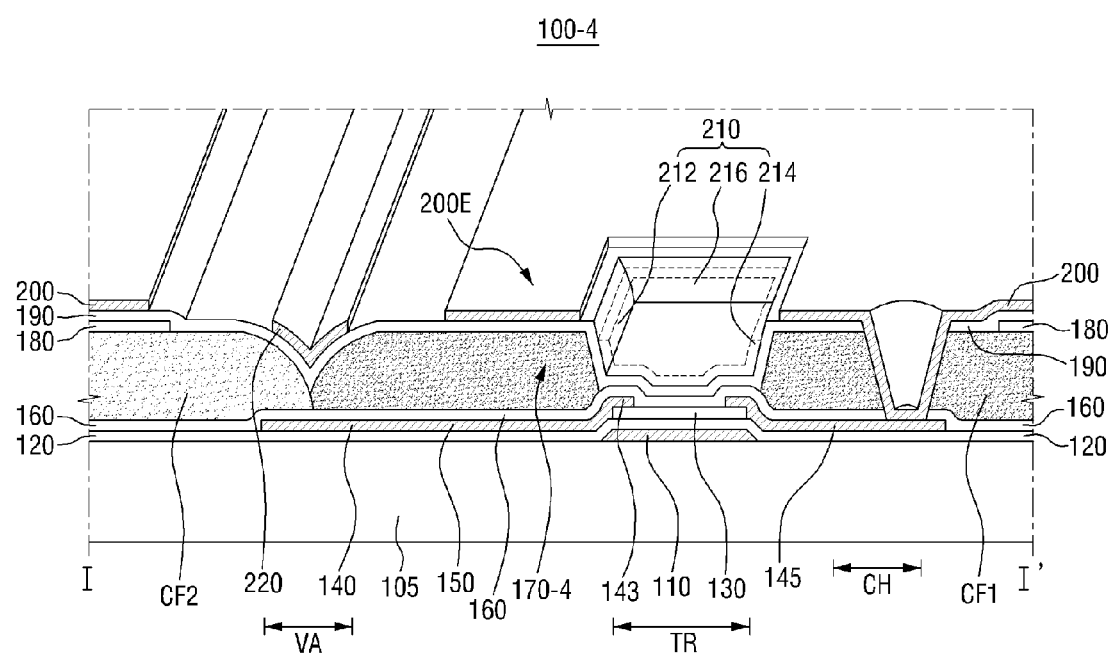
FIG. 4 is a perspective view of the thin film transistor array substrate according to another embodiment of the present invention.
Figure 5:
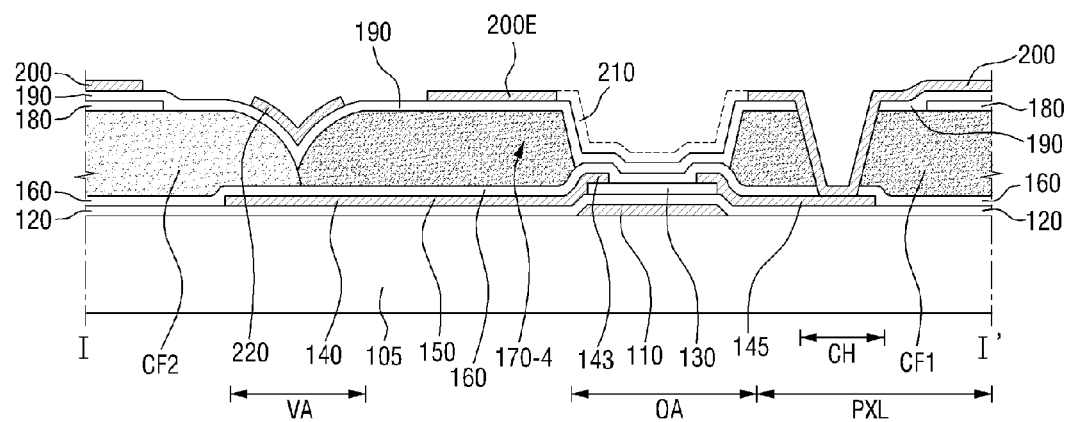
FIG. 5 is a cross-sectional view of a thin film transistor array substrate according to another embodiment of the present invention.

FIG. 4 is a perspective view of a thin film transistor array substrate according to another embodiment of the present invention, and FIG. 5 is a cross-sectional view of a thin film transistor array substrate according to another embodiment of the present invention.

Here, FIGS. 4 and 5 will be described with reference to FIGS. 1 to 3, and the repeated elements will be briefly described or omitted.

Referring to FIGS. 4 and 5, a thin film transistor array substrate 100-4 according to another embodiment of the present invention is different from the thin film transistor array substrate 100 according to an embodiment in that the color organic film (CF) is removed in the formation region of the thin film transistor (TR) other than the contact hole (CH) to form an open area (OA). Also, a difference from one embodiment of the present invention is that the residue electrode 210 disposed on at least partial open area (OA) can be disposed.

In a region in which the thin film transistor (TR) is formed, the open area (OA) formed by removing the color organic film (CF) can be disposed, and the color organic film (CF) adjacent to the open area (OA) and the contact hole (CH) formed by removing the first insulating film 160 and the second insulating film 190 can be disposed. Here, in the open area (OA), it is possible to perform an open process which removes the color organic film (CF) even without an additional mask process, by removing the color organic film (CF) in the formation region of the thin film transistor (TR) when forming the contact hole (CH) for connecting the pixel electrode 200 and the drain electrode 145.

On the open area (OA), for the same reason that the residue pattern 220 disposed in the valley area (VA) is formed, the residue electrode 210 can be disposed on the bottom surface and the side surface of the open area (OA). Specifically, the residue electrode 210 can be disposed on the bottom surface of the open area (OA), i.e., on the first and second insulating films (160, 190), and the residue electrode 210 can also be disposed on the side surface of at least one open area (OA).

The first residue electrode 212 of the residue electrode 210 disposed on the side surface disposed adjacent to the data line 140 may be connected to the extension pixel electrodes 200E disposed between the open area (OA) and the residue pattern 220.

Moreover, the second residue electrode 214 can be disposed on the side surface of the open area (OA) disposed adjacent to the contact hole (CH), and the second residue electrode 214 may be connected to the pixel electrode 200. The third residue electrode 216 disposed between the first residue electrode 212 and the second residue electrode 214 may also be connected to the pixel electrode 200.

As described above, at least any one of the first, second and third residue electrodes (212, 214, 216) can be disposed so to be connected to the adjacent electrodes. The first, second and third residue electrodes (212, 214, 216) may also be arranged so as to float in the adjacent electrodes.

In this way, in the thin film transistor array substrate 100-4 according to another embodiment of the present invention, the residue electrode 210 can be disposed on the open area (OA) that exposes the thin film transistor region. At least one residue electrodes 210 may be arranged so as to be connected to the pixel electrode 200 or the extension pixel electrode 200E.

Moreover, the extension electrode 150 can be further disposed between the data line 140 and the source electrode 143 so that the contact hole (CH) and the open area (OA) are spaced apart from the data line 140 at a predetermined interval. The separating organic film 170-4 can be disposed on the extension electrode 150.

The separating organic film 170-4 may be disposed between the open area (OA) and the valley area (VA). The valley area (VA) and the open area (OA) are formed with a valley, and the residue can be formed on the photo-mask process. Thus, a failure may occur in which the metal material disposed at the bottom of the photoresist remains due to the residue. The remaining metal material is connected to the adjacent electrode, which may cause short-circuit between the pixel regions (PXL).

For example, assuming a case where the separating organic film 170-4 is not disposed, a short-circuit failure may occur in which the residue pattern 220 disposed in the valley area (VA) is brought into contact with or connected to the residue electrode 210 disposed in the open area (OA). Accordingly, the short-circuit failure may occur in which the upper and pixel regions PXL are connected to each other.

However, in the thin film transistor array substrate 100-4 according to another embodiment of the present invention, by disposing the separating organic film 170-4 between the open area (OA) and the valley area (VA), the separating organic film 170-4 can provide the flattened space between the open area (OA) and the valley area (VA) in which the failure of photo properties mainly occurs, thereby providing the separation space that can allow floating of the residue pattern 220 formed due to the failure of photo properties.

In this way, the separation space disposed in the thin film transistor array substrate 100-4 according to the present embodiment can provide a controllable flattened surface in the photo-mask process when performing the photo-mask process, thereby providing the residue electrode 210 with the control space capable of separating the residue pattern 220.

Figure 6:
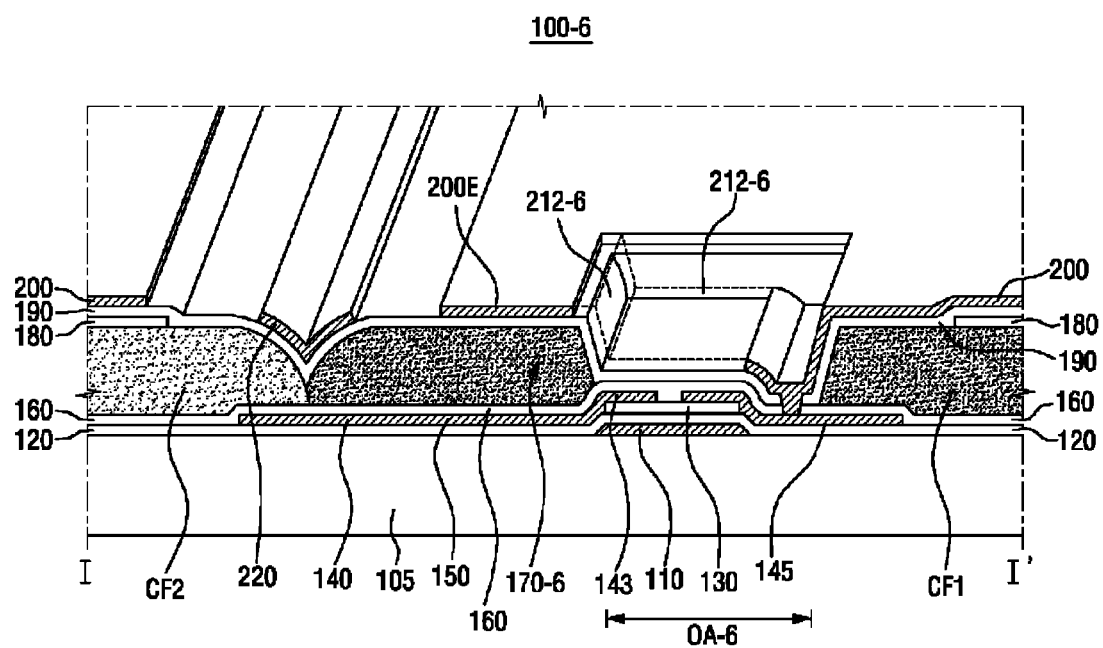
FIG. 6 is a perspective view of a thin film transistor array substrate according to still another embodiment of the present invention.
Figure 7:
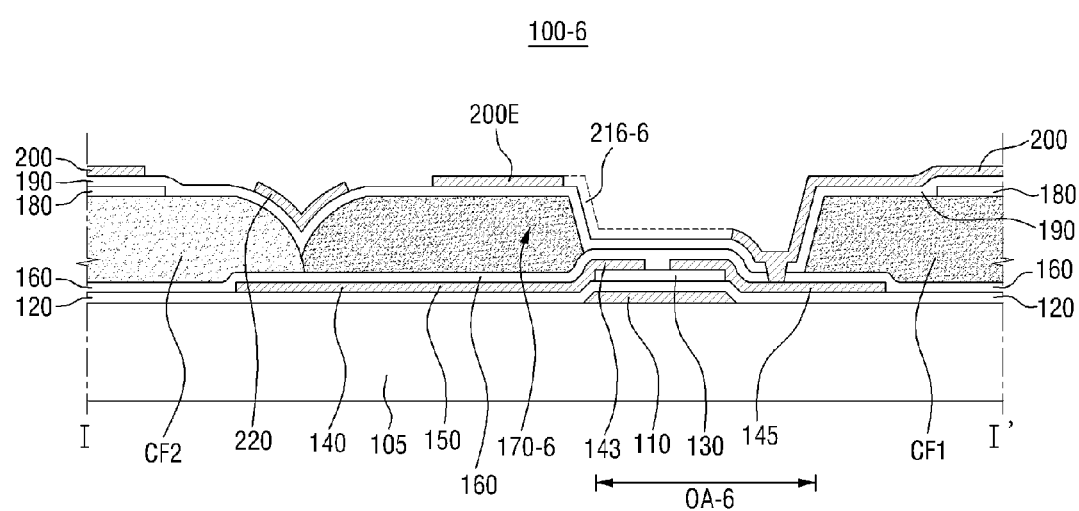
FIG. 7 is a cross-sectional view of a thin film transistor array substrate according to still another embodiment of the present invention and FIGS. 8 to 17 are cross-sectional views illustrating a method of manufacturing a thin film transistor array substrate according to an embodiment of the present invention.

FIG. 6 is a perspective view of a thin film transistor array substrate according to still another embodiment of the present invention, and FIG. 7 is a cross-sectional view of a thin film transistor array substrate according to still another embodiment of the present invention.

Here, FIGS. 6 and 7 will be described with reference to FIGS. 1 to 3, and the repeated elements will be briefly described or omitted.

Referring to FIGS. 6 and 7, a thin film transistor array substrate 100-6 according to still another embodiment of the present invention is different from the thin film transistor array substrate 100-4 according to another embodiment in that an open area (OA-6) is formed by removing the color organic film (CF) in a region in which the thin film transistor (TR) including the contact hole (CH) is formed. Also, a difference from one embodiment of the present invention is that the residue electrode 210 disposed on at least partial open area can be disposed.

Further, for the same reason that the residue pattern 220 disposed in the valley area (VA) is formed in the open area (OA-6), the residue electrode 210-6 can be disposed on the bottom surface and the side surface of the open area (OA-6). Specifically, the residue electrode 210-6 can be disposed on the bottom surface of the open area (OA-6), i.e., on the first and second insulating films (160, 190), and the residue electrode 210-6 can also be disposed on the side surface of at least one open area (OA-6).

The first residue electrode 212-6 of the residue electrode 210-6 disposed on the side surface disposed adjacent to the data line 140 may be connected to the extension pixel electrodes 200E disposed between the open area (OA-6) and the residue pattern 220.

The third residue electrode 216-6 disposed adjacent to the first residue electrode 212-6 can also be connected to the pixel electrode 200.

Although the second residue electrode 214-6 can be disposed on the side surface of the open area (OA-6) disposed adjacent to the contact hole (CH) in another embodiment of the present invention, the pixel electrode 200 may be disposed on the side surface of the open area (OA-6) disposed adjacent to the contact hole (CH) in still another embodiment according to the present invention.

In this way, in order to form the pixel electrode 200 on the side surface of the open area (OA-6) disposed adjacent to the contact hole (CH), specifically, in order to connect the pixel electrode 200 to the side surface of the open area (OA-6), i.e., to the upper surface of the color organic film (CF) via the inclined side surface, the first residue electrode 212-6 and the third residue electrode 216-6 can be connected to and disposed in the pixel electrode 200 and the extension pixel electrode 200E, respectively.

Thus, in the thin film transistor array substrate 100-6 according to still another embodiment of the present invention, the residue electrode 210-6 can be disposed in the open area (OA-6) which exposes the thin film transistor region. The residue electrode 210-6 can be disposed so as to be connected to the pixel electrode 200 or the extension pixel electrode 200E.

The extension electrode 150 can be further disposed between the data line 140 and the source electrode 143 so that the contact hole (CH) and the open area (OA-6) are spaced apart from the data line 140 at a predetermined interval. A separating organic film 170-6 can be further disposed on the extension electrode 150.

The separating organic film 170-6 can be disposed between the open area (OA-6) and the valley area (VA). Since the valley area (VA) and the open area (OA-6) are formed with a valley, the residue can be formed on the photo-mask process. Thus, a failure may occur in which the metal material disposed at the bottom of the photoresist remains due to the residue. The remaining metal material is connected to the adjacent electrodes which may cause short-circuit between the pixel regions (PXL).

For example, assuming a case where the separating organic film 170-6 is not disposed, a short-circuit failure may occur in which the residue pattern 220 disposed in the valley area (VA) is brought into contact with or connected to the residue electrode 210-6 disposed in the open area (OA-6). Accordingly, the short-circuit failure may occur in which the upper and lower pixel regions PXL are connected to each other.

However, in the thin film transistor array substrate 100-6 according to still another embodiment of the present invention, by disposing the separating organic film 170-6 between the open area (OA-6) and the valley area (VA), the separating organic film 170-6 can provide the flattened space between the open area (OA-6) and the valley area (VA) in which the failure of photo properties mainly occurs, thereby providing the separation space that can allow floating of the residue pattern 220 formed due to the failure of photo properties.

In this way, the separation space formed by the separating organic film 170-6 disposed in the thin film transistor array substrate 100-6 according to the present embodiment can provide a controllable flattened surface in the photo-mask process when performing the photo-mask process, thereby providing the residue electrode 210-6 with the control space capable of separating the residue pattern 220.

FIGS. 8 to 17 are cross-sectional views illustrating a method of manufacturing the thin film transistor array substrate according to an embodiment of the present invention. Here, the description will be provided by referring to FIGS. 1 to 3, and the repeated elements will be briefly described or omitted.

Figure 8:
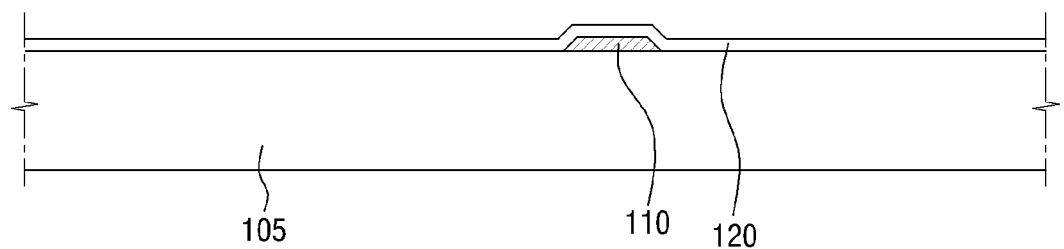

As illustrated in FIG. 8, the gate line 115 and the gate electrode 110 branching from the gate line 115 are formed by laminating and patterning a conductive material on the substrate 105 made of a transparent glass, quartz, plastic or the like.

The gate line 115 and the gate electrode 110 can be formed of aluminum-based metal such as aluminum (Al) and aluminum alloy, silver-based metal such as silver (Ag) and silver alloy, copper-based metal such as copper (Cu) and copper alloy, molybdenum-based metal such as molybdenum (Mo) and molybdenum alloy, chromium (Cr), titanium (Ti), tantalum (Ta) or the like.

The gate line 115 and the gate electrode 110 can have a multiple film structure that includes two conductive films having the different physical properties (not illustrated). One conductive film of them is formed of metal with low resistivity, for example, aluminum (Al)-based metal, silver (Ag)-based metal, copper (Cu)-based metal or the like so as to be able to reduce signal delay or voltage drop of the gate electrode 110. In contrast, the other conductive film is formed of other materials, particularly, materials having excellent contact properties with ITO (indium tin oxide) and IZO (indium zinc oxide), for example, molybdenum (Mo)-based metal, chromium (Cr), titanium (Ti), tantalum (Ta) or the like. As good example of these combinations, it is possible to adopt a lower Cr film and an upper Al film, and a lower Al film and an upper molybdenum film. However, the present invention is not limited thereto, and the gate line 115 and the gate electrode 110 may be made of various several metals and conductors.

In this way, by depositing the metal material on the substrate 105 and patterning the metal material through the photo-mask process and the etching process so as to form the gate line 115 and the first gate electrode 110, the gate line 115 and the gate electrode 110 can be formed.

Furthermore, the gate insulating film 120 formed of silicon oxide or silicon nitride is formed on the whole surface of the substrate 105 including the gate electrode 110. The gate insulating film 120 may be formed, for example, by CVD (Chemical Vapor Deposition), PECVD (Plasma Enhanced Chemical Vapor Deposition) or the like.

Figure 9:
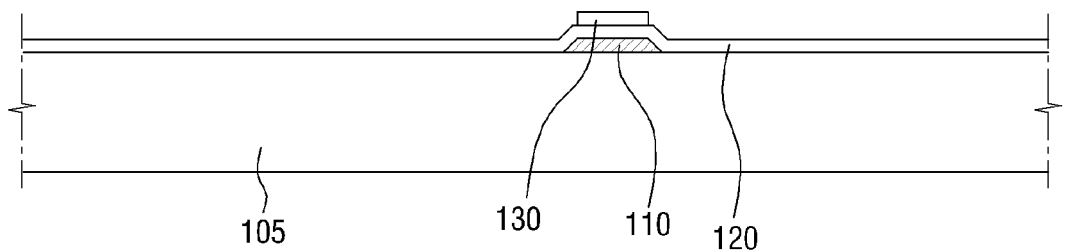

As illustrated in FIG. 9, the semiconductor layer 130 made of hydrogenated amorphous silicon or polycrystalline silicon is formed on the gate insulating film 120. Otherwise, the semiconductor layer 130 may be formed of oxide-based oxide semiconductor including zinc oxide (ZnO) or the like. The semiconductor layer 130 can be formed so that at least a part thereof is disposed so as to beg superimposed with the gate electrode 110.

As the semiconductor layer 130, for example, by forming the semiconductor material layer made of the amorphous silicon or the like on the whole surface of the substrate 105 formed with the gate insulating film 120, and by performing the photo-mask process and the etching process, the pattern of the semiconductor layer 130 can be formed. Here, the semiconductor layer 130 can have various shapes such as an island pattern and a linear pattern, and as illustrated, it can be disposed on the gate electrode 110 in a shape of an island pattern.

Although it not illustrated in the drawings, an ohmic contact layer made of a material such as n$^+$ hydrogenated amorphous silicon, in which silicide or n-type impurity is doped at high density, can be disposed on the semiconductor layer 130.

Figure 10:
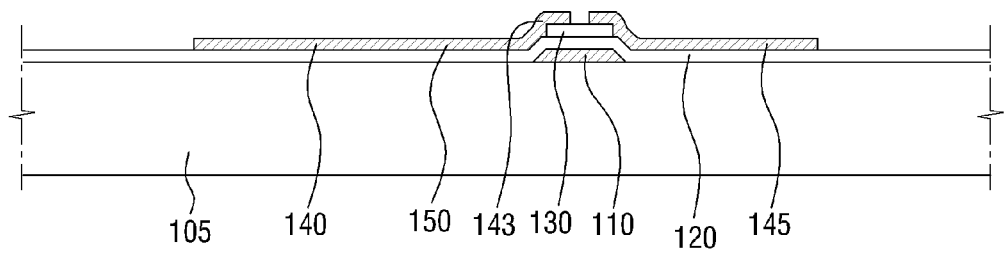

As illustrated in FIG. 10, the source electrode 143 connected to the data line 140 so as to be at least partially superimposed with the semiconductor layer 130, and the drain electrode 145 spaced apart from the source electrode 143 are formed on the substrate 105 formed with the semiconductor layer 130.

It is possible to further form the extension electrode 150 between the data line 140 and the source electrode 143. The extension electrodes 150 can separate the formation region of the thin film transistor (TR) from the data line 140 at a predetermined interval. In other words, the extension electrode 150 can form the separation distance of the thin film transistor (TR) from the contact hole (CH).

The extension electrode 150 can be selectively formed on the drain electrode 145 in some embodiments. Here, when forming the extension electrode 150 in the drain electrode 145, the thin film transistor (TR) can be disposed adjacent to the data line 140, and the contact hole (CH) can be formed so as to be spaced apart from the data line 140 at a predetermined interval.

The reason for spacing the contact hole (CH) and the data line 140 through the extension electrode 150 at a predetermined interval will be described in detail in the step of forming the pixel electrode 200 below.

In this way, it is possible to form the source electrode 143 and the extension electrode 150 branching from the data line 140, and the drain electrode 145 spaced apart from the source electrode 143 at a predetermined interval. Here, the metal layer can be deposited so as to form the data line 140, the extension electrode 150, the source electrode 143 and the drain electrode 145, a mask pattern can be formed using a mask process or the like, and it is possible to form the patterns of the data line 140, the source electrode 143, the drain electrode 145 and the extension electrode 150 using an etching process.

Here, a part of the source electrode 143 and the drain electrode 145 may be formed on the ohmic contact layer. Meanwhile, the semiconductor layer 130 and the data lines 140, the source electrode 143, the drain electrode 145 and the extension electrode 150 may be selectively formed at the same time, and in this case, the data line 140, the extension electrode 150, the source electrode 143 and the drain electrode 145 may be disposed on the semiconductor layer 130.

The data line 140, the source electrode 143, the drain electrode 145 and the extension electrode 150 can be formed of chromium, molybdenum-based metal, and refractory metal such as tantalum and titanium. The data line 140, the source electrode 143, the drain electrode 145 and the extension electrode 150 may have a multilayer film structure made up of refractory metal low resistance material. For example, the data line 140, the source electrode 143, the drain electrode 145 and the extension electrode 150 can be formed of a double film of chromium and aluminum film or aluminum and molybdenum film, or a triple film of molybdenum film-aluminum film-molybdenum film.

Figure 11:
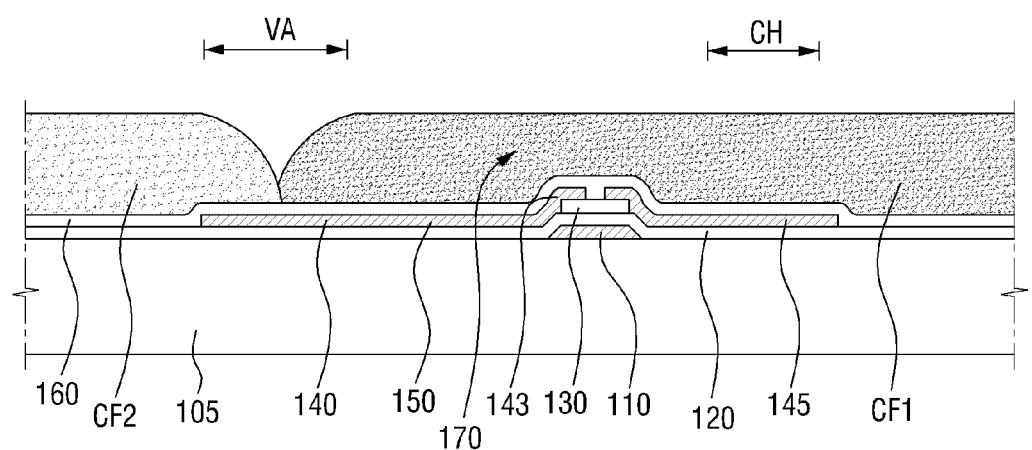

As illustrated in FIG. 11, it is possible to form the first insulating film 160 on the whole surface of the substrate formed with the data line 140, the extension electrode 150, the source electrode 143 and the drain electrode 145, and it is possible to form the color organic film (CF) on the first insulating film 160.

The first insulating film 160 can be formed of an inorganic material consisting of silicon nitride (SiNx) or silicon oxide (SiOx). The first insulating film 160 is able to protect the exposed semiconductor layer 130 from the first insulating film 160 as an inorganic material.

The color organic film (CF) can be formed of an organic material having excellent planarization characteristics and photosensitivity, an insulating material having low dielectric constant or the like.

As the color organic film (CF), it is possible to dispose the color organic films (CF) of different colors based on the data line 140 as a boundary. Thus, the color organic films (CF) may be formed on the data line 140 by being partially superimposed. Here, the color organics films (CF) disposed so as to be partially superimposed can form the valley area (VA) having a valley shape. For example, the first color organic film (CH) and the second color organic film (CF2) can be formed on the basis of the valley area (VA).

Meanwhile, the color organic film (CF) can form the separating organic film 170 disposed at the position corresponding to the extension electrode 150. The separating organic film 170 may be disposed between the formation regions of the valley area (VA) and the contact hole (CH) formed on the data line 140 to space them apart from each other.

The separating organic film 170 may be formed of the color organic film (CF) having the same color as the color organic film (CF) disposed in the same pixel area. For example, the separating organic film 170 disposed in the same pixel area (PXL) as the first color organic film (CF1) can be formed in the same color, or it can be formed integrally using the integrated first color organic film (CF1) in the same manufacturing process.

Figure 12:
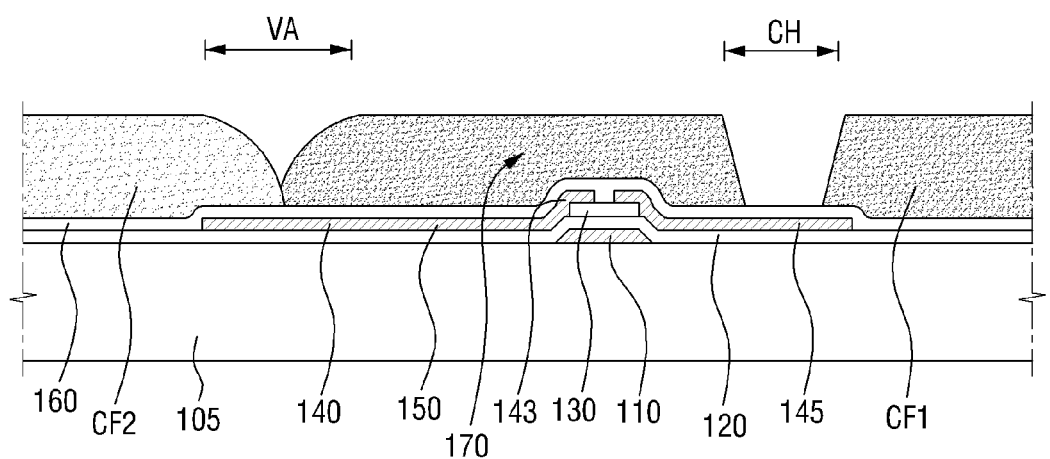

As illustrated in FIG. 12, in order to form the contact hole (CH), the color organic film (CF) on the drain electrode 145 is etched. Here, the contact hole (CH) can be selectively open to the first insulating film 160 without being exposed to the drain electrode 145.

Meanwhile, when the color organic film (CF) is etched to form the contact hole (CH), as in the second embodiment, it is also possible to selectively form the open area (OA) by etching the color organic film (CF) in the formation region of the thin film transistor (TR), while etching the hole for forming the contact hole (CH). Also, as in the third embodiment, it is also possible to selectively form the open area (OA-6) which includes the formation region of the thin film transistor and the formation region of the contact hole (CH).

In this way, since the process of forming the color organic film 170 on the first insulating film 160 can have a double film structure of the lower inorganic film and the upper organic film so as to protect the portion of the exposed semiconductor layer 130, while taking advantage of the excellent planarization characteristics of the color organic film (CF), it is possible to improve the aperture ratio of the display device including the thin film transistor array substrate according to the present embodiment.

Figure 13:
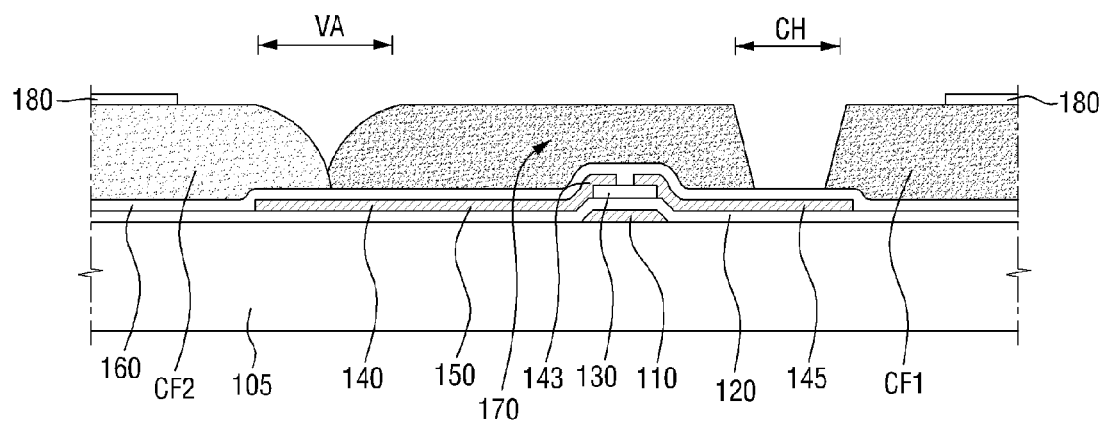

As illustrated in FIG. 13, it is possible to form the common electrode 180 on the color organic film 170.

The common electrode 180 is formed on the whole surface of the substrate 105, and the common electrode 180 may not be formed in the formation region of the partial line and the thin film transistor (TR). The common electrode 180 may be formed of the same material as that of the pixel electrode and may be formed of, for example, a transparent conductive oxide such as IZO and ITO. In order to form the pattern of the common electrode 180, the common electrode 180 can be formed while passing through the photo-mask process, the etching process or the like. Here, the formation of the common electrode 180 will be described with reference to the contents of the pixel electrode. Moreover, for convenience of process, the orders of FIGS. 12 and 13 can be selectively performed by changing each other.

Figure 14:
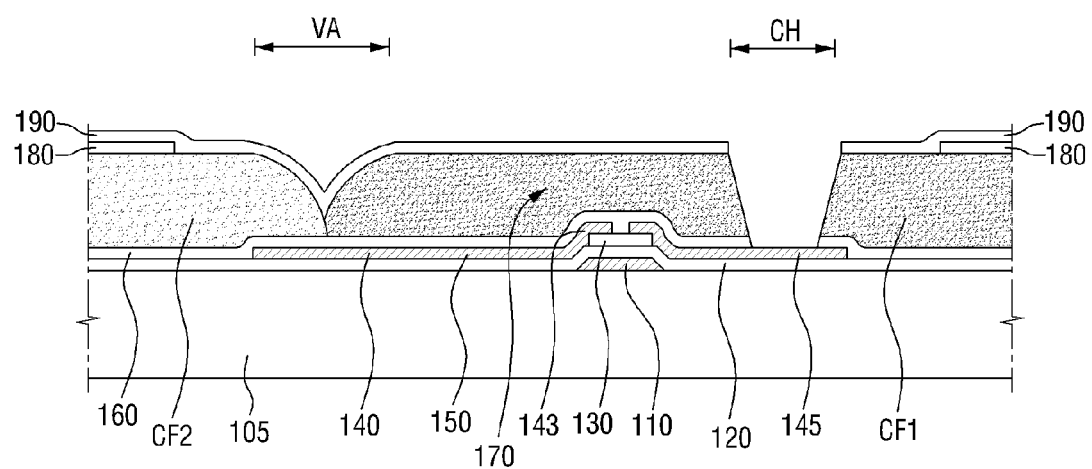

As illustrated in FIG. 14, the second insulating film 190 is formed on the substrate 105 formed with the common electrode 180, and the first insulating film 160 and the second insulating film 190 disposed on the region of the contact hole (CH) are etched to expose a part of the drain electrode 145.

The second insulating film 190 may be formed of the same material as that of the first insulating film 160.

Figure 15:
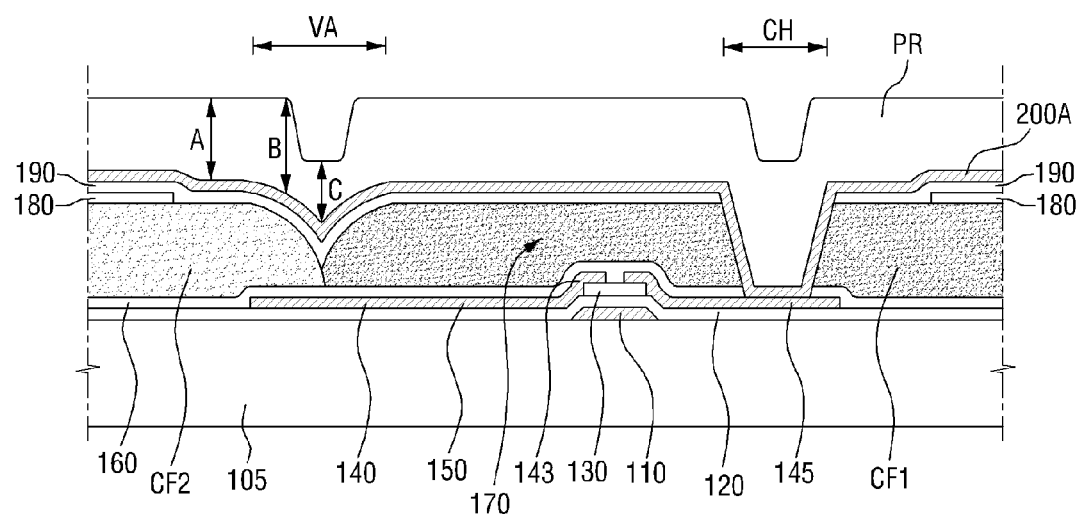

As illustrated in FIG. 15, the pixel electrode material is deposited on the substrate 105 formed with the second insulating film 180 to form a pixel electrode material layer 200A, and a photoresist (PR) for patterning the pixel electrode material layer 200A is applied. As the pixel electrode material layer 200A, it is possible to use a transparent conductive oxide film (TCO) such as ITO or IZO.

First, the different application thicknesses of the photoresist on the region of the valley area (VA) and the contact hole (CH) can be formed.

For example, the photoresist PR formed on the flattened surface can be formed to have a first thickness A. Meanwhile, the thickness of the photoresist PR formed in the region of the valley area (VA) and the contact hole (CH) can be formed to have the second and third thicknesses (B, C). Therefore, as illustrated in the drawings, the first thickness A, the second thickness B and the third thickness C may be formed by the different thicknesses.

Here, the photoresist PR of the third thickness C represents the thickness of the photoresist PR applied at the deepest region of the valley, and the photoresist PR of the second thickness B represents the thickness of the photoresist PR at the boundary of start of the flattened surface and the valley.

This is because the application thickness is thickly formed in the valley area by the characteristics in which the organic material is filled earlier in the formation region of the valley due to the characteristics of the organic material such as photoresist PR, and the far thicker application thickness can be formed in the boundary area.

In this way, the residues of the photoresist PR can be formed due to the photoresist PR of the first, second and third thicknesses (A, B, C) formed by the different thicknesses. Specifically, a prescribed amount of exposure can be provided to the photoresist PR so as to expose the photoresist PR. Here, the amount of exposure can be determined based on the first thickness A as a flattened surface.

Therefore, while most of the photoresist PR disposed to the first thickness A can react, an unreacted region may exist in the photoresist PR formed to be thicker than the first thickness A due to the insufficient amount of exposure. Thus, an unreacted region can be formed in the photoresist PR formed to the second and third thickness (B, C).

Figure 16:
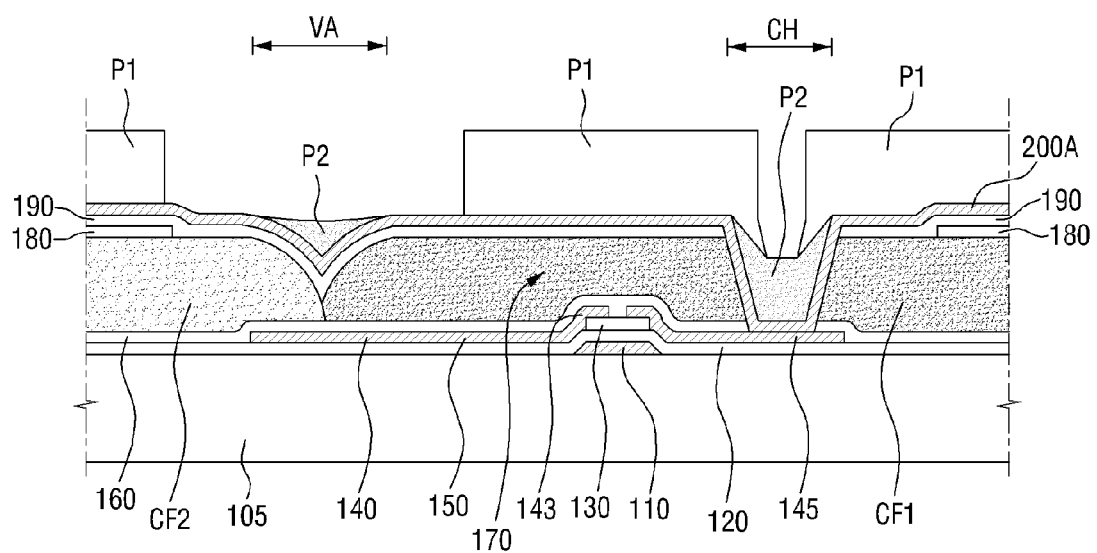

As illustrated in FIG. 16, it is possible to remove the reacted region between the acted region and the unreacted region by exposing the photoresist PR. Thus, the unreacted region remains and the first photoresist pattern P1 and the second photoresist pattern P2 can be formed.

It is possible to expose a part of the pixel electrode material layer 200A formed below the photoresist PR, while forming the first photoresist pattern P1. Moreover, in other regions, the pixel electrode material layer 200A may be covered with the first photoresist pattern P1.

Here, since the unreacted photoresist PR remains in the formation region of the valley such as the valley area (VA) or the contact hole (CH) region due to the insufficient amount of exposure, an unintended second photoresist pattern P2 can be formed. The pixel electrode material layer 200A may also remain at the bottom of the second photoresist pattern P2.

Thus, the exposed pixel electrode material layer 200A is etched by providing an etching solution onto the substrate which is formed with the first and second photoresist patterns (P1, P2).

Figure 17:
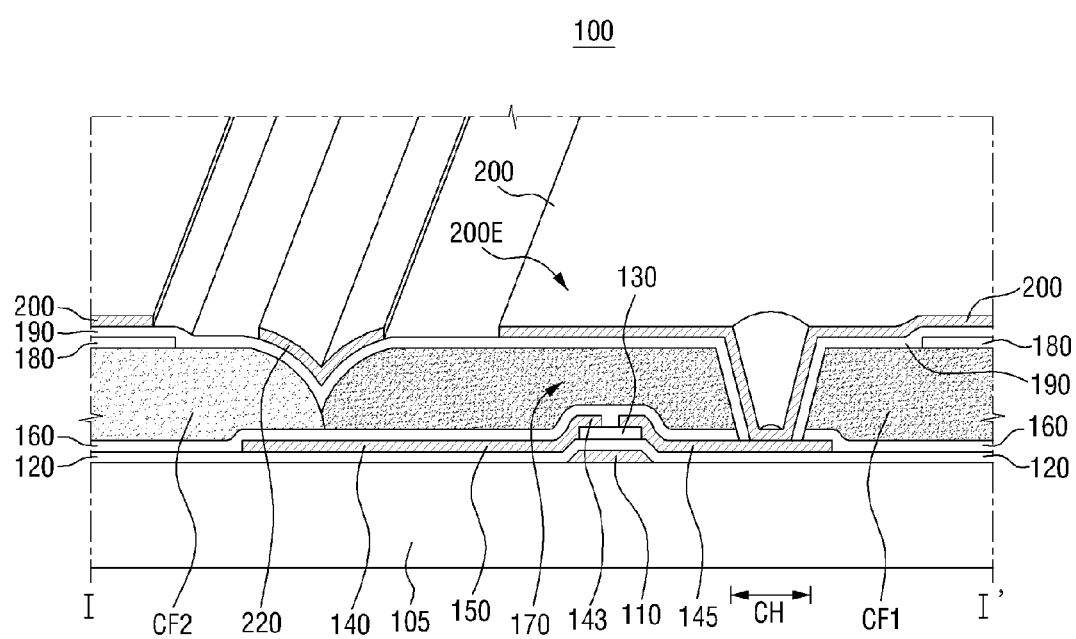

As illustrated in FIG. 17, the pixel electrode 200 can be formed by etching the pixel electrode material layer 200A. It is possible to simultaneously form the extension pixel electrode 200E, while forming the pixel electrode 200. Furthermore, since the pixel electrode material layer 200A remains at the bottom of the uncured region while forming the pixel electrode 200, the residue pattern 220 can be formed.

The residue pattern 220 can be formed on the valley area (VA) disposed on the data line 140. Since the residue pattern 220 is formed along the data line 140, failure connected to the adjacent pixel electrode 200 may occur. Furthermore, the residue electrode 210 similar to the residue pattern 200 can also be formed in the contact hole (CH) disposed adjacent to the valley area (VA). A failure may occur in which one of the residue electrode 210 or the residue pattern 220 is connected to the pixel electrode 200.

For example, the residue pattern 220 may be formed along the data line 140. The residue pattern 220 may cause a failure in which the data line 140 is disposed in the column direction and the adjacent upper and lower pixel electrodes 200 are connected to each other.

However, in this embodiment, it is possible to space the formation regions of the contact hole (CH) and the residue pattern 220 apart at a predetermined interval through the separating organic film 170. The contact hole (CH) and the valley area (VA) have valley shape, and the contact hole (CH) and the valley area (VA) are spaced apart from each other by the separating organic film 170, and they can be disposed so that the pixel electrode 200 and the residue pattern 220 formed thereon are spaced apart from each other.

Therefore, it is possible to prevent the failure in which the pixel electrode 200 and the residue pattern 220 are connected to each other.

Specifically, like the valley area (VA) and the contact hole (CH), by spacing the region in which the residue of photoresist can be generated, that is, by spacing the formation region of the valley, it is possible to prevent a failure in which the residue pattern 220 and the pixel electrode 200 are connected to each other.

Here, by disposing the separating organic film 170 between the valley area (VA) formed with residues and the formation region of the contact hole (CH), it is possible to secure the separation space by which the residue pattern 220 and the pixel electrode 200 can be spaced apart from each other.

It is possible to secure the separation space having the flattened surface formed of the separating organic film 170. In other words, it is possible to reduce the probability in which the residue pattern 220 and the pixel electrode 200 can be connected to each other, by the separation space as described above. Furthermore, since a controllable space is secured by the separation space as a flattened surface, it is possible to prevent the residue pattern 220 and the pixel electrode 200 from being connected to each other.

The residue pattern 220, the residue electrode 210 and the pixel electrode 200 formed of the pixel electrode material layer 200A may be formed of the same material. As the residue pattern 220, the residue electrode 210 and the pixel electrode 200, it is possible to use a transparent conductive oxide film (TCO) such as ITO or IZO.

Thus, like the valley area (VA) and the contact hole (CH), by spacing the region in which the residues of photoresist can be generated, that is, by spacing the formation region of the valley, it is possible to prevent a failure in which the residue pattern 220 and the pixel electrode 200 are connected to each other.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A thin film transistor array substrate comprising:
    a substrate which has a plurality of gate lines extending in a column direction along a boundary of pixels, a plurality of data lines extending in a row direction along the boundary of the pixels, and at least one thin film transistor formed in a pixel region;
    a first insulating film which covers the at least one thin film transistor;
    a color organic film which is disposed on the first insulating film and has a valley area formed with a valley by partial superimposition of organic films of different colors based on the data lines;
    a second insulating film which covers the color organic film and the valley area; and
    a pixel electrode which is disposed on the second insulating film and connected to the thin film transistor via a contact hole,
    wherein the thin film transistor array substrate is provided with a separating, organic film which extends from the color organic film and is disposed between the valley area and the contact hole,
    the at least one thin film transistor includes:
        a gate electrode which branches from the gate line for each pixel;
        a source electrode branching from the data line and a drain electrode spaced apart from the source electrode; and
        an extension electrode which is disposed between the data line and the source electrode to space the data line and the contact hole apart from each other,
    a separating organic film is disposed on the extension electrode, and
    an extension pixel electrode extending from the pixel electrode, disposed on the second insulating film and further disposed on the separating organic film.

2. The thin film transistor array substrate of claim 1, wherein the data line, the source electrode and the extension electrode are integrally formed.

3. The thin film transistor array substrate of claim 1, wherein the color organic film overlaps the gate line, and the color organic films of different colors are disposed around the data line.

4. The thin film transistor array substrate of claim 1, wherein the valley area is disposed in a region in which the color organic film is superimposed on the data line, or in a region in which the separating organic film is superimposed on the data line.

5. The thin film transistor array substrate of claim 1, wherein the color organic film and the separating organic film disposed on each pixel region are an organic film having the same color.

6. The thin film transistor array substrate of claim 1, wherein the separating organic film disposed in a separation space between the contact hole and the valley area is disposed as a flattened surface.

7. The thin film transistor array substrate of claim 1, wherein an open area, in which the color organic film is removed, is disposed in a formation region of the thin film transistor, and
    the separating organic film is disposed between the open area and the valley area.

8. The thin film transistor array substrate of claim 7, wherein the open area further includes a region in which the contact hole is disposed.

9. The thin film transistor array substrate of claim 7, wherein a residue electrode is further disposed on the second insulating film or on a side wall of the color organic film in the open area.

10. The thin film transistor array substrate of claim 9, wherein at least one residue electrode is disposed so as to be connected to the pixel electrode or the extension pixel electrode.

11. A thin film transistor array substrate comprising:
    a substrate which has a plurality of gate lines extending in a column direction along a boundary of pixels, a plurality of data lines extending in a row direction along the boundary of the pixels, and at least one thin film transistor formed in a pixel region;
    a first insulating film which covers the at least one thin film transistor;

a color organic film which is disposed on the first insulating film and has a valley area formed with a valley by partial superimposition of organic films of different colors based on the data lines;

a second insulating film which covers the color organic film and the valley area;

a pixel electrode which is disposed on the second insulating film and connected to the thin film transistor via a contact hole, and a residue pattern disposed in at least one valley area and formed of the same material as that of the pixel electrode, wherein the thin film transistor array substrate is provided with a separating organic film which extends from the color organic film and is disposed between the valley area and the contact hole.

12. A thin film transistor array substrate comprising:

a substrate which has a plurality of gate lines extending in a column direction along a boundary of pixels, a plurality of data lines extending in a row direction along the boundary of the pixels, and at least one thin film transistor formed in a pixel region;

a first insulating film which covers the at least one thin film transistor;

a color organic film which is disposed on the first insulating film and has a valley area formed with a valley by partial superimposition of organic films of different colors based on the data lines;

a second insulating film which covers the color organic film and the valley area;

a pixel electrode which is disposed on the second insulating film and connected to the thin film transistor via a contact hole, and a common electrode which is disposed between the color organic film and the second insulating film, wherein the thin film transistor array substrate is provided with a separating organic film which extends from the color organic film and is disposed between the vallev area and the contact hole.

* * * * *